United States Patent [19]

Rouse et al.

[11] Patent Number: 5,081,061

[45] Date of Patent: Jan. 14, 1992

[54] MANUFACTURING ULTRA-THIN DIELECTRICALLY ISOLATED WAFERS

[75] Inventors: George V. Rouse; Paul S. Reinecke, both of Indialantic, Fla.

[73] Assignee: Harris Corporation, Melbourne, Fla.

[21] Appl. No.: 668,694

[22] Filed: Mar. 7, 1991

Related U.S. Application Data

[63] Continuation of Ser. No. 483,711, Feb. 23, 1990, abandoned.

[51] Int. Cl.⁵ .............................................. H01L 21/76
[52] U.S. Cl. ......................................... 437/62; 437/86; 437/974
[58] Field of Search ............................ 437/62, 86, 974

[56] References Cited

U.S. PATENT DOCUMENTS 3,508,980  4/1970  Jackson et al. ..................... 148/175
3,689,357  12/1970  Jordan .................................. 428/163

FOREIGN PATENT DOCUMENTS 53-30284  3/1978  Japan .
55-11347  1/1980  Japan ..................................... 437/62
57-56944  4/1982  Japan ..................................... 437/62
57-102044  6/1982  Japan ..................................... 437/62
58-95836  6/1983  Japan ..................................... 437/62
59-18654  1/1984  Japan ..................................... 437/62
61-96748  5/1986  Japan ..................................... 437/62
62-48040  3/1987  Japan ..................................... 437/62
62-124753  6/1987  Japan ..................................... 437/62
63-219138  9/1988  Japan ..................................... 437/62

Primary Examiner—Olik Chaudhuri
Assistant Examiner—G. Fourson
Attorney, Agent, or Firm—Barnes & Thornburg

[57] ABSTRACT

A method including filling etched moats with a first dielectric layer and layer of polycrystalline material and planarizing. A second dielectric layer is formed on the first polycrystalline layer and a second layer of polycrystalline is formed on the second dielectric layer to form a handle. The starting material is then thinned to produce the dielectric isolated islands. Device forming steps are then performed. Finally, the handle is removed leaving a wafer having a thickness defined by the planarized surface of the first polycrystalline layer and the top surface of the first wafer.

4 Claims, 2 Drawing Sheets

5,081,061

MANUFACTURING ULTRA-THIN DIELECTRICALLY ISOLATED WAFERS

This is a continuation of application Ser. No. 07/483,711, filed Feb. 23, 1990, now abandoned.

BACKGROUND AND SUMMARY OF THE INVENTION

The present invention relates generally to dielectric isolated substrates and more specifically to method for forming ultra-thin dielectrically isolated wafers.

One common method of forming dielectrically isolated integrated circuit wafers is illustrated in FIGS. 1A through 1D. A semiconductor wafer 10 having a thickness generally in the range of 19 to 26 mils has grooves 12 etched in a first surface 14. The wafer 10 generally is selected such that the etch is anisotropic. The first surface 14 and moats 12 is then covered with a layer of dielectrical isolation 16. A polycrystalline support 18 is then formed over the dielectric isolation 16 and generally has a thickness in the range of 20 to 30 mils. The wafer 10 is then reduced by grinding from a second surface 20 until it intersects the dielectric isolation layer 16 to produce dielectric isolated regions 10 at a third surface 22. This process illustrated FIGS. 1A through 1D. The resulting dielectric isolation islands 10 have thickness in the range of the 10 to 40 microns and the total thickness of the wafer from the surface 22 to surface 24 of the polycrystalline support 18 is in the range of 19 to 26 mils. Device forming steps are then performed on surface 22 and the wafer shown is then used.

Although the process described above is now in common practice in the industry, earlier manufacturing processes had problems in developing a thick polycrystalline support 18. As a solution to this problem, Jordan, in U.S. Pat. No. 3,689,357 only provided a very thin polycrystalline layer in the one to two mil thickness range which did not over fill the moats. Then the moats were filled with fusing glass to be used to bond to a monocrystalline wafer to the polycrystalline support. This combined structure provided the appropriate support structure. The monocrystalline wafer was in the range of 10 mils.

There is substantial interest in a process to form ultra-thin wafers in the range below 7 mils. The processes of the prior art have not address the problem of forming such a thin wafer.

Thus it is a object of the present invention to provide a process for producing ultra-thin wafers having dielectric isolated integrated circuits therein.

Still another object of the present invention is to provide a method of fabricating ultra-thin dielectrically isolated circuits compatible with present processing technology. These and other objects are achieved by filling etched moats with a first dielectric layer and a first layer of polycrystalline material and planarizing. A second dielectric layer is formed on the first polycrystalline layer and a second layer of polycrystalline is formed on the second dielectric layer to form a handle. The starting material is then thinned to produce the dielectric isolated islands. Device forming step are then performed. Finally, the handle is removed leaving a wafer having a thickness defined by the planarized surface of the first polycrystalline layer and the top surface of the first wafer. The planarization and thinning produce a resulting wafer having a thickness below 7 mils. Removing the handle includes grinding the handle for a substantial portion of the handle thickness and etching the remainder of the handle using the second dielectric layer as an etch stop.

Other objects, advantages and novel features of the present invention will become apparent from the following detailed description of the invention when considered in conjunction with the accompanying drawings.

DETAILED DESCRIPTION OF THE DRAWINGS

Figure 1A:
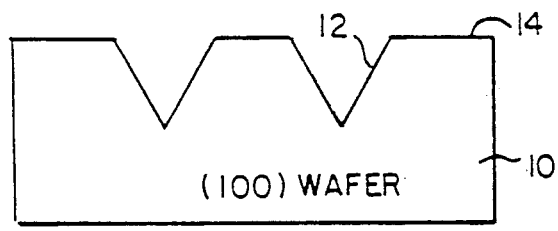
FIGS. 1A through 1D are cross sectional views illustrating various steps of manufacturing for the prior art.
Figure 1B:
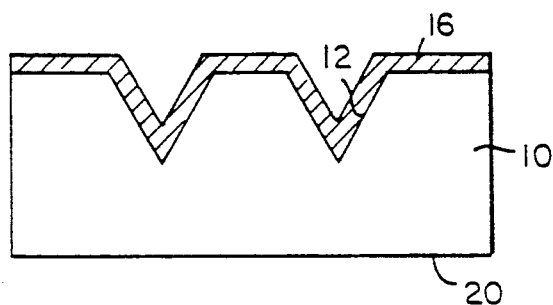
Figure 2A:
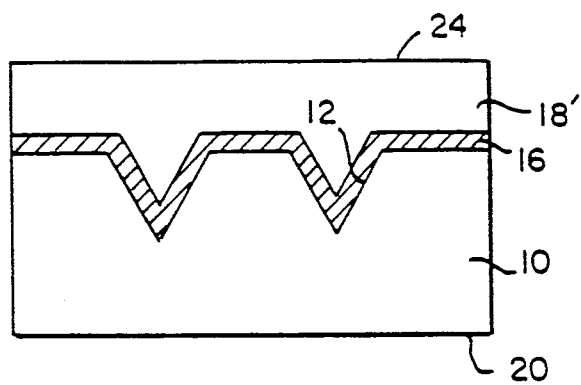
FIGS. 2A through 2D are cross sectional views illustrating various processing steps according to the principles of the present invention.

The process for fabricating a dielectrically isolated integrated circuit in an ultra-thin wafer begins in the prior art with FIGS. 1A through 1B, wherein the starting material or wafer 10 has moats 12 formed therein and covered with the first dielectric layer 16. At this stage, polycrystalline material is then deposited to form a thin polycrystalline support 18 which after planarization is illustrated in FIG. 2A.

Figure 1C:
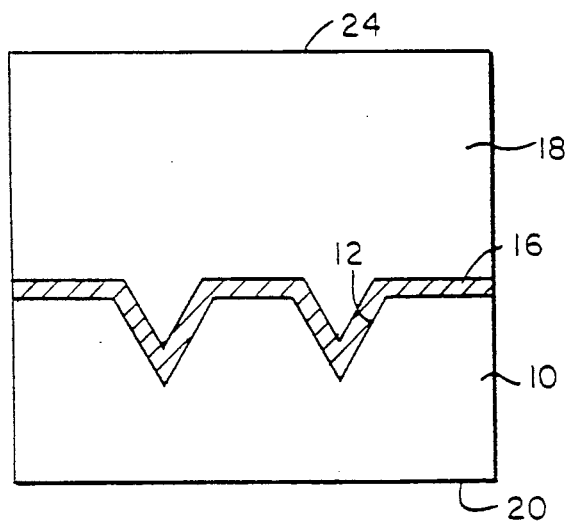
Figure 1D:
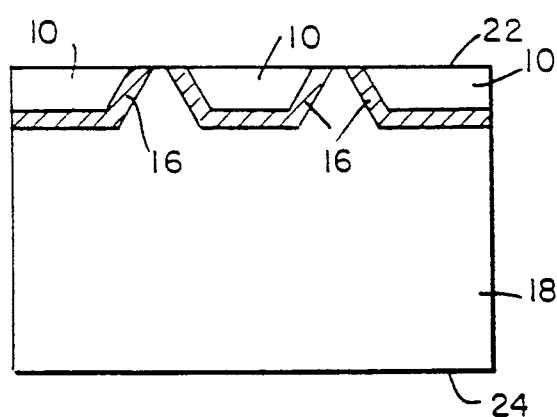

The thickness of the polycrystalline layer 18 from the planarized surface 24 to dielectric isolation layer 16 is in the range of 2 to 7 mils. This is substantially thinner than the polycrystalline support 18 to FIG. 1C, which is generally in the range of 19 to 26 mils.

Figure 2B:
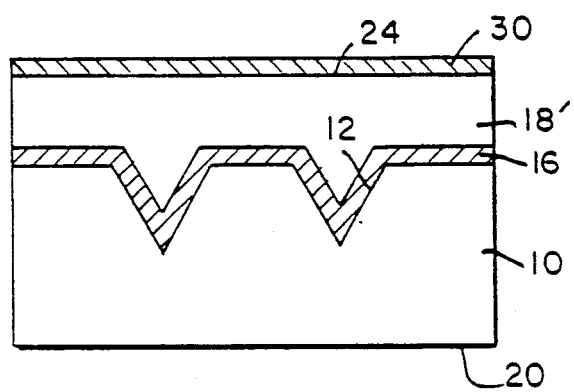
Figure 2C:
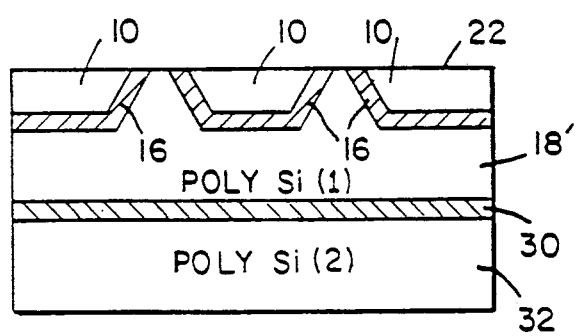
Figure 2D:
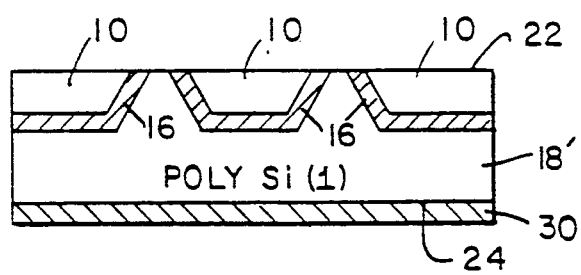

A second dielectric layer 30 is then formed on the planarized surface 24 of the polycrystalline support 18 as illustrated in FIG. 2B. The dielectric layer 30, having a thickness in the range of 1 to 2 microns, may be formed by chemical vapor deposition or thermal oxidation. A second layer polycrystalline material is then deposited on a second dielectric layer 30 to produce the handle 32 having a thickness in the range 12 to 20 mils, as illustrated in FIG. 2C. The surface 20 of the starting material 10 is then removed by grinding to form the surface 22 resulting in dielectrically islands 10 of the starting material. Device forming steps are then performed on the surface 22 in the islands 10.

Once the device forming steps and metallization are performed, handle 32 is removed by grinding a substantial portion of it and then removing the remainder by chemical etching with a KOH/water solution for example. The dielectric layer 30 operates as an etch stop. The dielectric layer 30 may then be removed or left in place. By leaving the dielectric layer 30 in place, the individual thin wafers can be stacked and bonded together. The resulting thickness from the surface 24 to the surface 22 is below 7 mils. The thickness of the dielectrically isolated islands 10 from surface 22 are in the range of 10 to 40 microns. Thus the present process produces not only thin device, but also a thin integrated circuit wafer which includes the thin devices.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed is:

1. A method of fabricating dielectrically isolated, integrated circuits in ultra-thin wafers comprising:

forming moats in a first surface of a first wafer having a first thickness;

forming a first dielectric layer on said first surface and said moats;

depositing a first polycrystalline layer on said first dielectric layer to fill said moats and planarizing to form a planar surface;

depositing a second dielectric layer on said first polycrystalline layer;

forming a handle on said second dielectric layer;

thinning said first wafer from a second surface to form dielectrically isolated islands at a third surface of said first wafer;

performing device formation steps on said third surface; and removing said handle down to said second dielectric layer to produce a wafer having a second thickness substantially defined by said planar surface of said first polycrystalline layer and said third surface of said first wafer.

2. A method according to claim 1, wherein said planarizing step and said thinning step are performed to form a wafer having said second thickness below 7 mils.

3. A method according to claim 1, wherein said removing step includes grinding said handle for a substantial portion of its thickness and etching the remaining portion of said handle using said second dielectric layer as a etching stop.

4. A method according to claim 1 wherein said handle is formed by depositing a second polycrystalline layer on said second dielectric layer.

* * * * *